United States Patent
Carberry et al.

(10) Patent No.: US 7,541,669 B2
(45) Date of Patent: Jun. 2, 2009

(54) SEMICONDUCTOR DEVICE PACKAGE WITH BASE FEATURES TO REDUCE LEAKAGE

(75) Inventors: Patrick Joseph Carberry, Laurys Station, PA (US); Jeffery John Gilbert, Schwenksville, PA (US); George John Libricz, Jr., Bethlehem, PA (US); Ralph Salvatore Moyer, Robesonia, PA (US); John William Osenbach, Kutztown, PA (US); Hugo Fernando Safar, Westfield, NJ (US); Thomas Herbert Shilling, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/788,346

(22) Filed: Apr. 19, 2007

(65) Prior Publication Data

US 2007/0241433 A1 Oct. 18, 2007

Related U.S. Application Data

(62) Division of application No. 11/015,534, filed on Dec. 18, 2004, now Pat. No. 7,224,047.

(51) Int. Cl.
*H01L 33/00* (2006.01)
*H01L 23/495* (2006.01)
*H01L 23/28* (2006.01)
*H01L 23/34* (2006.01)

(52) U.S. Cl. .............. 257/676; 257/E33.075; 257/675; 257/E33.057; 257/99; 257/433; 257/696; 257/712; 257/704; 257/707; 257/706; 257/710; 257/713; 257/680; 257/795; 257/784; 257/786

(58) Field of Classification Search ............. 57/676, 57/E33.075, E33.073, E33.057, 99, 433, 57/675, 696, 712, 704, 707, 706, 710, 713, 57/680, 795, 784, 786; 257/712, 704, 707, 257/706, 710, 713, 680, 795, 784, 786
See application file for complete search history.

(56) References Cited

U.S. PATENT DOCUMENTS 3,778,887 A * 12/1973 Suzuki et al. .............. 29/827

(Continued)

OTHER PUBLICATIONS

Attached are IDS's From the U.S. Appl. No. 11/015,534, filed Dec. 18, 2004 pursuant to 37 CFR 1.98(d)(1) No Copies of Cited References are Enclosed Herwith.

*Primary Examiner*—Alexander O Williams
(74) *Attorney, Agent, or Firm*—Mendelsohn & Associates, P.C.; Steve Mendelsohn

(57) ABSTRACT

A semiconductor device package comprises a container including a base and sidewalls. The base is configured to support a semiconductor device chip, and a lead frame extends through at least one of the sidewalls. A portion of the lead frame within the sidewall has at least one aperture penetrating into the lead frame. The sidewall material extends into the aperture, thereby forming a strong interfacial bond that provides a low leakage, sidewall-lead-frame interface. The base has a reentrant feature that is positioned within the thickness of at least one of the sidewalls and engages the at least one sidewall, thereby forming a low leakage base-sidewall interface. The top surface of the base has a groove that is positioned within the thickness of at least one of the sidewalls and engages the at least one sidewall, thereby enhancing the low leakage base-sidewall interface.

16 Claims, 2 Drawing Sheets

U.S. PATENT DOCUMENTS

| | | | | |
|---|---|---|---|---|
| 4,819,041 A * | 4/1989 | Redmond | .................... | 257/687 |
| 5,091,341 A * | 2/1992 | Asada et al. | ................... | 29/827 |
| 5,345,106 A * | 9/1994 | Doering et al. | ............. | 257/675 |
| 5,362,679 A * | 11/1994 | Wakefield | .................... | 29/827 |
| 5,378,924 A * | 1/1995 | Liang | ......................... | 257/675 |
| 5,381,042 A * | 1/1995 | Lerner et al. | ................ | 257/712 |
| 5,458,716 A * | 10/1995 | Alfaro et al. | ................ | 156/245 |
| 5,701,034 A * | 12/1997 | Marrs | ......................... | 257/706 |
| 5,783,860 A * | 7/1998 | Jeng et al. | ................... | 257/675 |
| 5,869,883 A * | 2/1999 | Mehringer et al. | .......... | 257/667 |
| 6,204,554 B1 * | 3/2001 | Ewer et al. | ................... | 257/705 |
| 6,326,678 B1 * | 12/2001 | Karnezos et al. | ............ | 257/666 |
| 6,517,218 B2 * | 2/2003 | Hochstein | .................... | 362/294 |
| 6,552,417 B2 * | 4/2003 | Combs | ....................... | 257/666 |
| 6,936,855 B1 * | 8/2005 | Harrah | ....................... | 257/88 |
| 6,943,433 B2 * | 9/2005 | Kamada | ...................... | 257/666 |
| 2003/0057573 A1 * | 3/2003 | Sekine et al. | ............... | 257/787 |
| 2004/0232425 A1 * | 11/2004 | Kawata | ....................... | 257/72 |
| 2004/0232435 A1 * | 11/2004 | Hofer et al. | .................. | 257/99 |
| 2004/0262741 A1 * | 12/2004 | Koike et al. | ................. | 257/706 |
| 2005/0269587 A1 * | 12/2005 | Loh et al. | ..................... | 257/99 |

* cited by examiner

SEMICONDUCTOR DEVICE PACKAGE WITH BASE FEATURES TO REDUCE LEAKAGE

CROSS-REFERENCE TO RELATED APPLICATIONS

This application is a division of application Ser. No. 11/015,534 filed on Dec. 18, 2004, now U.S. Pat. No. 7,224,047 issued on May 29, 2007.

BACKGROUND OF THE INVENTION

1. Field of the Invention

This invention relates to packages for semiconductor devices (e.g., integrated circuit chips, discrete device chips, or both) and, more particularly, to such packages designed to reduce leakage, for example, of encapsulant from the package or of harmful substances (e.g., vapors, liquids, particles) from the ambient into the package.

2. Discussion of the Related Art

In the semiconductor device industry it is common to fabricate device packages from a metallic base and plastic or other polymer sidewalls. One of the many potential package types is known as an open cavity package, which is commonly used in applications where high thermal loads must be handled including, but not limited to, power devices (e.g., radio frequency, laterally diffused MOSFETs or RFLDMOS-FETs). The most common open cavity package includes a high thermal conductivity base, ceramic side walls and embedded leads. These packages are typically of the hermetic or semi-hermetic variety. In both varieties the semiconductor device or chip is connected to the base and the leads, and the chip is protected from the outside environment by a substantially leak-tight sealed lid. As such, there is no requirement for semiconductor device encapsulant for environmental protection. For lower cost applications, the ceramic side walls of the package can be replaced with plastic. Many of the open cavity plastic packages are non-hermetic by design. In this case the semiconductor device must be encapsulated so that unwanted environmental degradation does not occur. The best environmental protection is achieved when the entire cavity (including the semiconductor device, wire bonds, package leads, and package base) is filled with a protective encapsulant such as silicone.

We have found that non-hermetic plastic packages fabricated in this or similar fashion have a number of problems associated with encapsulant leaking out of the cavity during the cavity fill process. Often the encapsulant leaking problem is not present in as-received open cavity packages. However, after die attach and wire bonding, when the packages are typically filled with encapsulant, we have observed that encapsulant does leak out at the plastic-to-metal interfaces of the package. This leakage results primarily from degradation of the interfaces between the different parts of the package, which in turn results from differences in the thermal expansion coefficients of the base, lead frame and sidewall materials as well as from less than ideal design. The difference in thermal expansion between the plastic side walls and the metal base and metal leads causes the plastic and metal to separate in one or more locations along the bond line. This separation provides leakage paths that allow the encapsulant to flow from the cavity to the outside surfaces of the package.

Thus, a need remains in the art for a semiconductor device package that reduces the leakage of encapsulant from the filled cavity.

In addition, these leaky interfaces also permit harmful substances (e.g., moisture, solvents, air-born particles) from the ambient to enter the package, where they can have a deleterious effect on device operation or package integrity.

Thus, a need remains in the art for a semiconductor device package that reduces the leakage of such harmful substances from the ambient into the package.

BRIEF SUMMARY OF THE INVENTION

In accordance with one aspect of our invention, a semiconductor device package comprises a container including a base and sidewalls of materials having different thermal expansion coefficients. The base is configured to support a semiconductor device chip, and a lead frame extends through at least one of the sidewalls. The package is characterized in that a portion of the lead frame within the sidewall has at least one aperture penetrating into the lead frame. The sidewall material extends into (e.g., molds around) the aperture, thereby forming a strong interfacial bond that provides a low leakage, sidewall-lead-frame interface.

In accordance with another aspect of our invention, the base has a reentrant feature that is positioned within the thickness of at least one of the sidewalls. This feature acts to engage or capture the side wall in such a way as to provide a strong, low leakage base-sidewall interface.

In accordance with yet another aspect of our invention, the top surface of the base has a groove that is positioned within the thickness of at least one of the sidewalls and engages the at least one sidewall, thereby forming a low leakage base-sidewall interface.

BRIEF DESCRIPTION OF THE SEVERAL VIEWS OF THE DRAWING

Our invention, together with its various features and advantages, can be readily understood from the following more detailed description taken in conjunction with the accompanying drawing, in which.

DETAILED DESCRIPTION OF THE INVENTION

Figure 1:
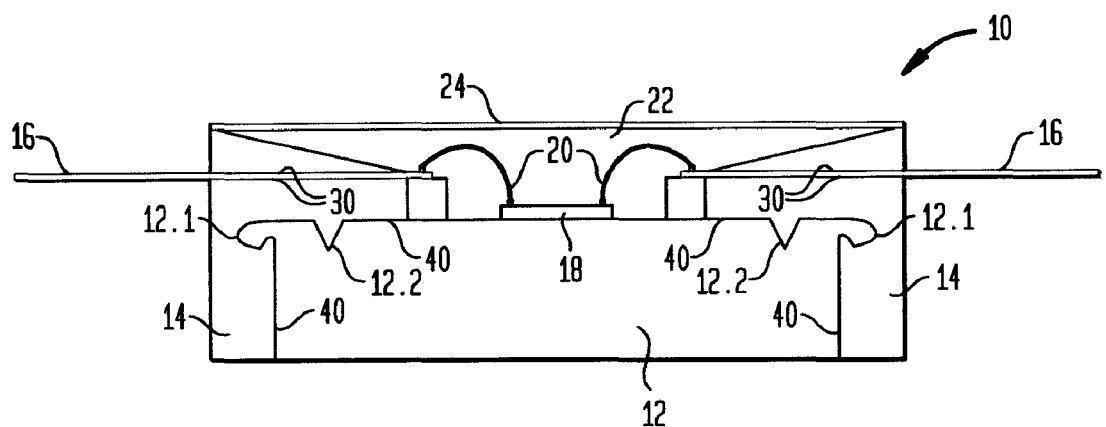
FIG. 1 is a schematic, cross sectional view of a semiconductor device package in accordance with one embodiment of our invention.

With reference now to FIG. 1, we show a semiconductor device package 10 for housing one or more semiconductor device chips 18; e.g., integrated circuit chips, discrete device chips, or both. The package 10 is formed by a container having a thermally conducting (e.g., metallic) base 12, which often serves as a heat sink and an electrical connection, and an electrically insulating (e.g., plastic or other polymer) sidewalls 14. An electrically conducting (e.g., metallic) lead frame 16 extends through at least one of the sidewalls 14 in order to facilitate making electrical contact to the chip 18, which is mounted on the base 12. To this end, electrical conductors 20 (typically wire bonds) are connected between terminals on the interior ends of the lead frame 16 and terminals on the chip 18. The chip 18 and the conductors 20 are covered by a protective encapsulant 22, which illustratively fills the container and is itself covered by a lid 24. Illustratively, the encapsulant includes single or multiple layers of silicone and/or a hard material such as HYSOL® FP4470 Encapsulant, which is commercially available from the electronics division of Henkel Loctite Corporation located in Industry, Calif.

This type of open cavity package is typically formed in an insert mold cavity, where the base and lead frame are inserted into the mold cavity and plastic (or other polymer) is molded around these metallic components.

The lead frame, as is well known in the art, is designed to accept wire bonds from the semiconductor chip and to carry electrical signals between the chip and an external electrical circuit.

The metallic materials of the base and lead frame do not adhere well to the plastic material of the sidewalls and have thermal expansion coefficients different from that of the sidewall material, which in prior art designs tends to make leaky interfaces 30 between the lead frame 16 and the sidewalls 14 and leaky interfaces 40 between the base 12 and the sidewalls 14. More specifically, during thermal excursions of the package (e.g., during high temperature processing steps, such as the common step of using eutectic AuSn solder, which melts at approximately 280° C., to bond the chip 18 to the base 12), the base and sidewall, and the lead frame and sidewall, both expand. Because the thermal expansion of the side wall is different from that of metallic base and lead, the metal exerts a force that deforms the plastic. Often this deformation is non-elastic. More specifically, whereas the metallic base and lead frame naturally return to their original shapes upon cooling, the plastic side wall does not, resulting in a gap between the metal and the plastic. Such gaps undesirably allow encapsulant to leak out. In addition, liquids, vapors and/or air-born particles can also enter the package cavity via these gaps. Both types of leakage can degrade the device reliability.

In accordance with one aspect of our invention, as shown in FIGS. 2-6, the problem of a leaky lead-frame-sidewall interface 30 is addressed by forming fillable features 16.2-16.7 in the lead frame 16; that is, the features may be, for example, apertures 16.2, 16.3 (FIG. 2, FIG. 3, respectively), which are etched through the entire thickness lead frame, or depressions 16.4 (FIG. 4; only one is shown for simplicity), which are stamped into the lead frame. For purposes of illustration, the depression 16.4 is shown only in the top surface of the lead frame, but it could also be located in the bottom surface of the lead frame or in both surfaces. The features may take on myriad geometric shapes such as, for example, circular (e.g., a linear array of tandem, oppositely facing semicircles 16.2-16.4 as in FIGS. 2-4; tandem stadium-like shapes or ovals 16.5 as in FIG. 5), rectangular (e.g., parallel rows of offset rectangles 16.6 as in FIG. 6), triangles (e.g., interlocking diamonds and bowties 16.7 as in FIG. 7), or any suitable combination of such shapes. The number of such features utilized is a matter of design choice; only two or three are shown in FIGS. 2 and 5-7 for simplicity. The features may be arranged head-to-tail, as the semicircles 16.2 of FIG. 2. Alternatively, the semicircles may "interlock" to block line-of-sight leakage paths between adjacent horseshoes and across the sidewall. Line-of-sight leakage paths are blocked, for example, in the features illustrated by the rectangles and diamond-bowtie features of FIGS. 6-7.

After the features are formed, the sidewall 14 is molded around the lead frame 16 so that material of the sidewall fills the features, thereby engaging the lead frame and forming a relatively leak-free interface 30. The features 16.2-16.7 have an additional advantage; they inhibit unwanted movement of the lead frame within the package.

In accordance with another aspect of our invention, as shown in FIG. 1, the problem of a leaky base-sidewall interface 40 is addressed by forming reentrant features 12.1 (e.g. hook-like flanges) on the outer edges of the base 12. After the reentrant feature 12.1 is formed, the sidewall is molded around the base (at the same time that it is molded around the lead frame 16). The molding process, of course, means that the base and sidewalls are at an elevated temperature. During the cooling cycle, the reentrant feature 12.1 of the metallic base 12 engages the plastic sidewall 14, thereby pulling the sidewall back into place and forming a relatively leak-free interface 40.

In general, the reentrant feature 12.1 is formed on at least one edge of the base 12, but preferably on all such edges to ensure that a relatively leak-free interface 40 is formed around the entire package. Moreover, the reentrant feature may be continuous along each edge, or it may be segmented. The latter design has the advantage that it forms "teeth" that provide better locking of the base to the sidewalls. Although the reentrant feature 12.1 is depicted as being located at the top surface of the base, it could be positioned lower.

In addition, in accordance with yet another aspect of our invention, the problem of a leaky base-sidewall interface 40 is addressed by forming grooves 12.2 in the top surface of the base 12 and under the sidewalls 14. The groove should be formed with sharp (rather than rounded) top edges, since the former inhibit the encapsulant 22, before it is cured (i.e., when it is still in low-viscosity gel form) from leaking out through interface 40. In general, the groove 12.2 is formed along at least one edge of the base 12, but preferably on all such edges to ensure that a relatively leak-free interface 40 is formed around the entire package. The shape of the groove is otherwise not critical; for example, it can be V-shaped (as shown in FIG. 1) or it can be rectangular (not shown).

It is to be understood that the above-described arrangements are merely illustrative of the many possible specific embodiments that can be devised to represent application of the principles of the invention. Numerous and varied other arrangements can be devised in accordance with these principles by those skilled in the art without departing from the spirit and scope of the invention. In particular, each of the three design features discussed above may be used separately or in any combination thereof, but preferably all three are used together to lock the polymer to the metal, thereby maximizing the reduction in leakage of encapsulant from the package and/or the leakage of harmful substances from the ambient into the package.

EXAMPLE

This example describes the fabrication of a package for RFLDMOS (i.e., radio frequency, laterally diffused, metal-oxide-semiconductor) ICs, in accordance with one embodiment of our invention. Various materials, dimensions and operating conditions are provided by way of illustration only and, unless otherwise expressly stated, are not intended to limit the scope of the invention. This type of package illustratively contains six chips: two chips that function as active ICs (i.e., high power RFLDMOS transistors) and four that function as passive ICs (i.e., capacitors).

The container 12 had overall dimensions of 810 mils in length, 385 mils in width, and 99 mils in height. The sidewalls 14 and lid 24 were made of a liquid crystal polymer (LCP) material (e.g., VECTRA ® S-135 LCP Material, which is commercially available from Ticona located in Florence, Kentucky). The sidewalls were 72.5 mils thick in the region where the lead frame extended through the sidewalls, whereas the lid 24 had overall dimensions of 810 mils in length, 384 mils in width, and 43 mils in thickness. The base was made of copper (e.g., CDA 194) and had overall dimensions of 810 mils in length, 325 mils in width, and 50 mils in height/thickness.

The lead frame 16 was made of copper (e.g., CDA 151) and the portion extending through each of two opposite sidewalls had overall dimensions of about 600 mils in length and 5 mils in thickness. The width, which is measured in the same dimension as the sidewall width, is unspecified and not critical since the lead frame extends on both sides of the sidewalls. Five stadium-like or oval features were formed in tandem in each of the two lead frames 16. Thus, each stadium feature included two semicircular features that faced one another. The stadium features were about 55 mils in length and were spaced on 92.5 mil centers. Each semicircular feature had about a 10 mil radius.

Figure 8:
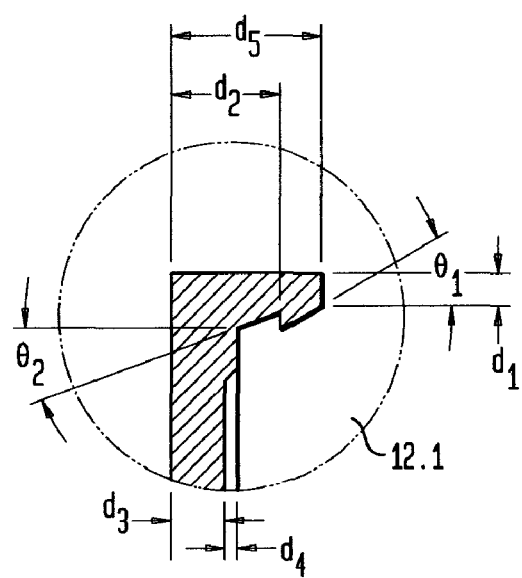
FIG. 8 is a cross-sectional view of a reentrant feature formed on the base in accordance with an illustrative embodiment of our invention.
Figure 2:
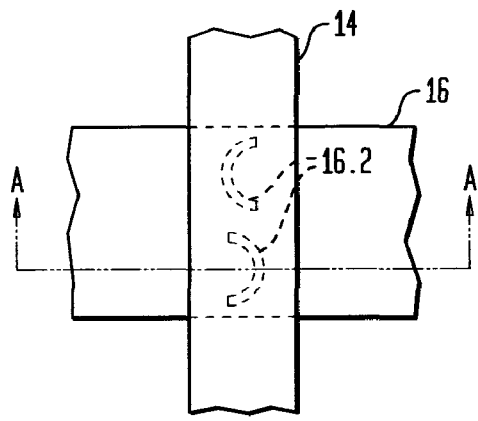
FIG. 2 is a schematic, top view of a lead-frame-sidewall interface having horseshoe features in accordance with another embodiment of our invention.
Figure 3:
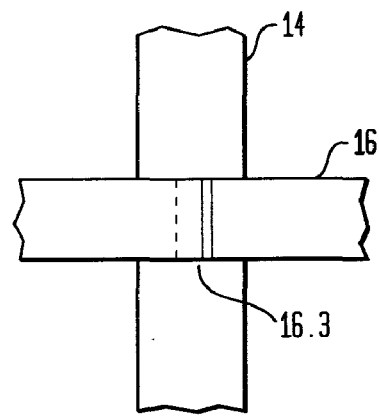
FIG. 3 is a cross-sectional view taken along line A-A of FIG. 2 for the case where the feature extends entirely through the thickness of the lead frame.
Figure 4:
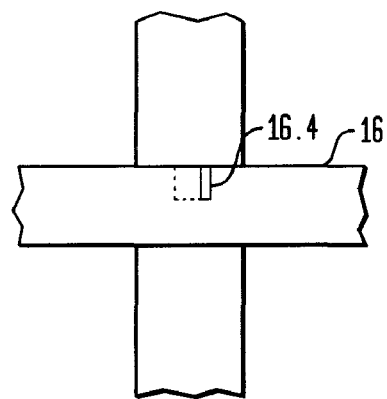
FIG. 4 is a cross-sectional view taken along line A-A of FIG. 2 for case where the feature is a depression in the lead frame.
Figure 5:
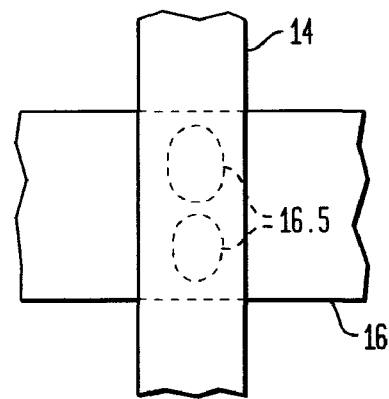
FIG. 5 is a schematic, top view of a lead-frame-sidewall interface having oval features in accordance with another embodiment of our invention.
Figure 6:
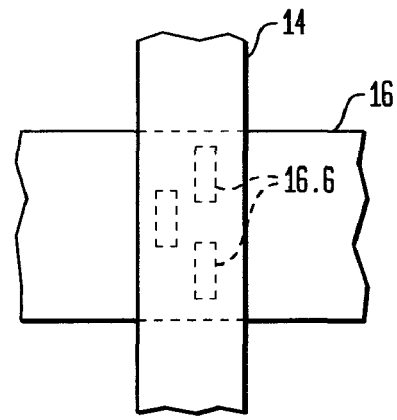
FIG. 6 is a schematic, top view of a lead-frame-sidewall interface having rectangular features in accordance with one more embodiment of our invention.
Figure 7:
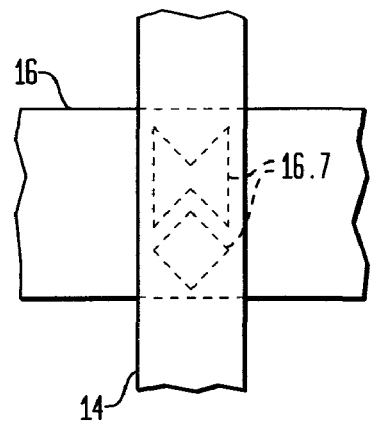
FIG. 7 is a schematic, top view of a lead-frame-sidewall interface having triangular features in accordance with another embodiment of our invention.

The reentrant feature 12.1 was formed along the entire length and width of the base 12. The feature 12.1 had the reentrant shape shown in FIG. 8 and had the following approximate dimensions: $d_1=20$ mils, $d_2=73$ mils, $d_3=35$ mils, $d_4=8$ mils, $d_5=100$ mils, $\theta_1=28°$, and $\theta_2=18°$.

The groove 12.2 was also formed along the entire length and width of the base 12. It was stamped into the base, had a V-shape with a rounded bottom in cross-section as shown in FIG. 1, and had the following approximate dimensions: 15 mils in maximum width and 10 mils in depth, with the sides of the V making a 60° angle with one another.

The encapsulant 22 was a single layer of cured silicone gel and was about 40 mils thick. The gel, which was purchased from Dow Corning, Midland, Mich. and was identified as HIPEC® Q3-6646 Semiconductor Protective Coating, was oven cured at a temperature of about 150° C. for about 120 min.

We claim:

1. A semiconductor device package comprising:
   a container including a base and sidewalls, said base configured to support a semiconductor device chip, said base and sidewalls comprising materials having different thermal expansion coefficients, and
   a lead frame extending through at least one of said sidewalls, characterized in that said base has at least one reentrant feature that is positioned within the thickness of at least one of said sidewalls and engages said at least one sidewall, wherein the at least one reentrant feature is a hook-like flange that engages a reciprocal feature of the at least one sidewall to inhibit lateral separation of the at least one sidewall from the base.

2. The package of claim 1, wherein said reentrant feature is located at the side and near the top of said base.

3. The package of claim 1, further including at least one conductor electrically coupling said lead frame to said chip, and an encapsulant covering said chip and said conductor.

4. A semiconductor device package comprising:
   a container including a base and sidewalls, said base configured to support a semiconductor device chip, said base and sidewalls comprising materials having different thermal expansion coefficients, and
   a lead frame extending through at least one of said sidewalls, characterized in that said base has at least one groove that is positioned within the thickness of at least one of said sidewalls and engages said at least one sidewall, wherein:
   the at least one groove is defined by a recess between two plateau regions of substantially equal height on a top surface of the base;
   the at least one sidewall has a reciprocal protrusion in a bottom-facing surface of the at least one sidewall; and
   the recess defining the at least one groove in the base receives the reciprocal protrusion of the at least one sidewall.

5. The package of claim 4, wherein said groove has sharp corners at the top of said base.

6. The package of claim 4, further including at least one conductor electrically coupling said lead frame to said chip, and an encapsulant covering said chip and said conductor.

7. The package of claim 1, wherein the at least one reentrant feature is continuous along at least one edge of the base mating with the at least one sidewall.

8. The package of claim 1, wherein the at least one reentrant feature is segmented along at least one edge of the base to form teeth mating with the at least one sidewall.

9. The package of claim 1, wherein the base further comprises at least one groove that is positioned within the thickness of at least one of said sidewalls and engages said at least one sidewall.

10. A base for supporting a semiconductor device chip in a semiconductor device package, wherein:
    the base comprises a plurality of outer edges adapted to mate with sidewalls of the semiconductor device package;
    the base has at least one reentrant feature that is adapted to be positioned within the thickness of at least one of said sidewalls and to engage said at least one sidewall, wherein the at least one reentrant feature is a hook-like flange that engages a reciprocal feature of the at least one sidewall to inhibit lateral separation of the at least one sidewall from the base.

11. The base of claim 10, wherein the at least one reentrant feature is continuous along each edge of the base adapted to mate with one of the sidewalls.

12. The base of claim 10, wherein the at least one reentrant feature is segmented along at least one edge of the base to form teeth adapted to mate with said at least one sidewall.

13. The base of claim 10, wherein the base further comprises at least one groove that is positioned within the thickness of at least one of said sidewalls and engages said at least one sidewall.

14. The base of claim 10, wherein the base and the sidewalls comprise materials having different thermal expansion coefficients.

15. The base of claim 13, wherein:
    the at least one groove is defined by a recess between two plateau regions of substantially equal height on a top surface of the base;
    the at least one sidewall has a reciprocal protrusion in a bottom-facing surface of the at least one sidewall; and
    the recess defining the at least one groove in the base receives the reciprocal protrusion of the at least one sidewall.

16. The package of claim 9, wherein:
    the at least one groove is defined by a recess between two plateau regions of substantially equal height on a top surface of the base;
    the at least one sidewall has a reciprocal protrusion in a bottom-facing surface of the at least one sidewall; and
    the recess defining the at least one groove in the base receives the reciprocal protrusion of the at least one sidewall.

* * * * *